(12) United States Patent
Lian et al.

(10) Patent No.: US 6,387,578 B1
(45) Date of Patent: May 14, 2002

(54) POST-EXPOSURE HEAT TREATMENT TO REDUCE SURFACE ROUGHNESS OF PMMA SURFACES FORMED BY RADIATION LITHOGRAPHY

(75) Inventors: Kun Lian; Zhong-Geng Ling, both of Baton Rouge, LA (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 0 days.

(21) Appl. No.: 09/566,261

(22) Filed: May 5, 2000

(51) Int. Cl.$^7$ ............................. G03F 7/20; G03F 7/38
(52) U.S. Cl. ..................... 430/11; 430/296; 430/326; 430/330; 430/966; 430/967
(58) Field of Search .................. 430/326, 330, 430/966, 967, 296, 11

(56) References Cited

U.S. PATENT DOCUMENTS

| | | | |
|---|---|---|---|
| 4,393,129 A | 7/1983 | Glashauser et al. | 430/296 |
| 5,496,668 A | 3/1996 | Guckel et al. | 430/9 |

OTHER PUBLICATIONS

Chabloz, M. et al., "Improvement of sidewalls roughness in deep silicon etching," Book of Abstract, HARMST '99, Kisarazu, Japan, Jun. 13–15, 1999, pp. 26–27 (1999).

Egert, C.M. et al., "Dimensional variation and roughness of LIGA fabricated microstructures," SPIE, vol. 2880, pp. 200–209 (1996).

Gebhard, U. et al., "Combination of a fluidic micro–oscillator and micro–actuator in LIGA–technique for medical application," Transducers '97, Chicago, Jun. 16–19, 1997, pp. 761–764 (1997).

Griffiths, S.K. et al., "The influence of mask substrate thickness on exposure and development times for the LIGA process," Book of Abstract, HARMST '99, Kisarazu, Japan, Jun. 13–15, 1999, pp. 86–87 (1999).

Guckel, H. et al., "Direct, high throughput LIGA for commercial applications: A progress report," Book of Abstract, HARMST '99, Kisarazu, Japan, Jun. 13–15, 1999, pp. 2–3 (1999).

Lian, K. and Z.–G. Ling, "PMMA Surface Morphology Change as the Function of X–ray Exposing Condition and Post Heat Treatment," published in the HARMST '99, Book of Abstract, Jun. 13–15, 1999, Kisarazu, Japan.

Lian, K., Z.–G. Ling, and S.B. Looney, "PMMA Surface Morphology Change as the Function of X–ray Exposing Condition and Post Heat Treatment," submitted to Microsystem Technologies, Jun. 13, 1999.

Malek, C.G.K. et al., "Factors promoting the adhesion of acrylic sheets to metallic structures for LIGA processing," Book of Abstract, HARMST '99, Kisarazu, Japan, Jun. 13–15, 1999, pp. 110–111 (1999).

(List continued on next page.)

*Primary Examiner*—Richard L. Schilling
(74) *Attorney, Agent, or Firm*—Bonnie J. Davis; John H. Runnels; André J. Porter

(57) ABSTRACT

A method to decrease the surface roughness of exposed PMMA surfaces has been discovered. PMMA surface roughness was decreased by a post-exposure heat treatment of less than 70° C. The optimum post-exposure heat treatment to produce a PMMA microstructures with a smooth surface was found to be about 60° C. for about 30 min. The structural features of post-exposure heat-treated PMMA patterns were not statistically different from otherwise identical features of untreated PMMA patterns. This method produces a smoother PMMA structure that may then optionally be glued on a substrate or that may be assembled with other PMMA structures into a three-dimensional or multilayer microstructure.

21 Claims, 5 Drawing Sheets

(2 of 5 Drawing Sheet(s) Filed in Color)

OTHER PUBLICATIONS

Malek, C.K. et al., "Lithographic related problems in deep X–ray lithography: Radiation–induced formation of volatile species in poly(methylmethacrylate) (PMMA)," Book of Abstract, HARMST '99, Kisarazu, Japan, Jun. 13–15, 1999, pp. 112–113 (1999).

Malek, C.K. et al., "Metrology study of structural transfer accuracy in fabrication of high–aspect–ratio microelectromechanical systems: From optical mask to polished electroplated parts," J. Vac. Sci. Technol. B, vol. 16(6), pp. 3552–3557 (1998).

Pantenburg, F.J. et al., "Improved adhesion of deep X–ray lithography resist structures by using a mirror system," Book of Abstract, HARMST '99, Kisarazu, Japan, Jun. 13–15, 1999, p. 122 (1999).

Vladimirsky, Y. et al., "PMMA as an X–ray resist for micro–machining application: Latent image formation and thickness losses," Microelectronic Engineering, vol. 30, pp. 543–546 (1996).

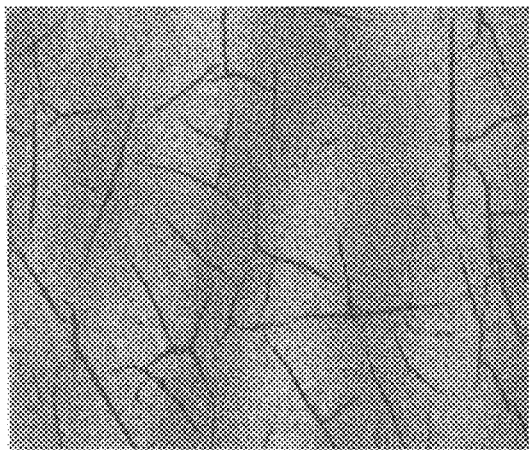
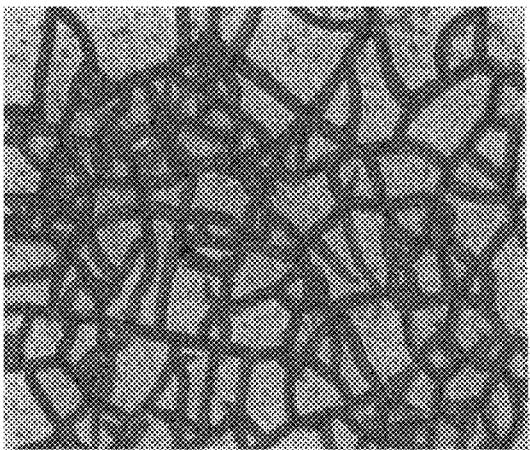
Fig. 2a						Fig. 2b
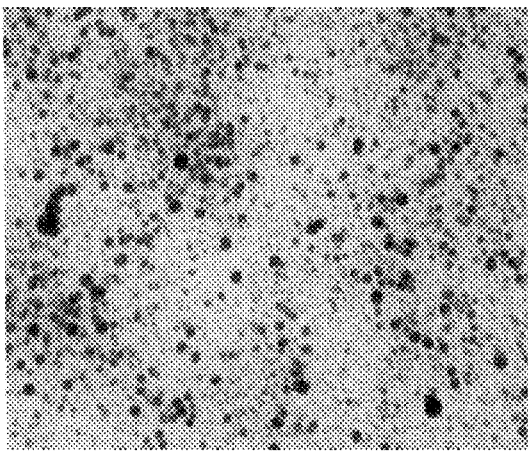
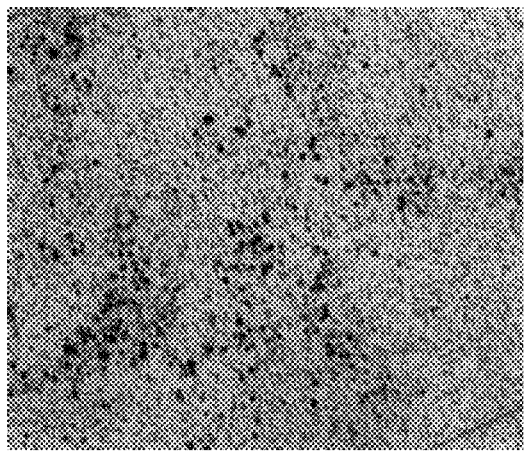
Fig. 2c						Fig. 2d

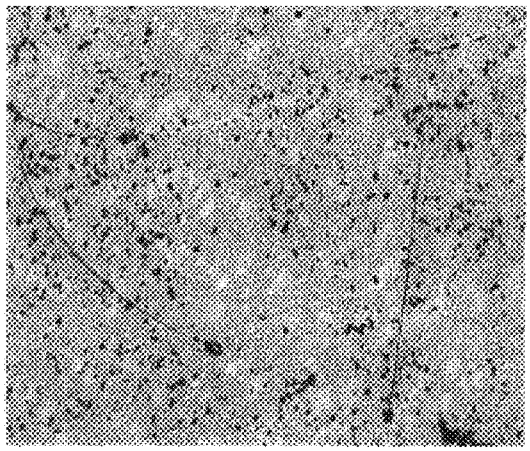
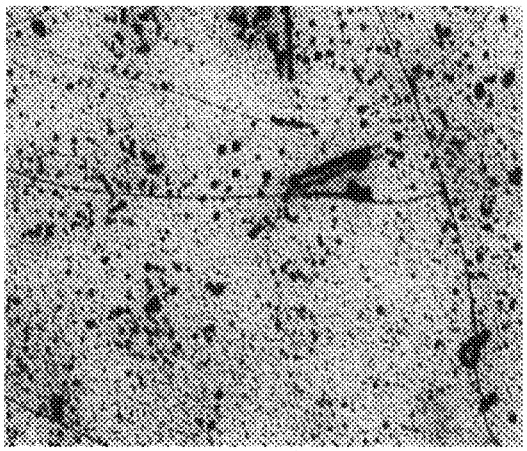
Fig. 4a　　　　　　　　Fig. 4b
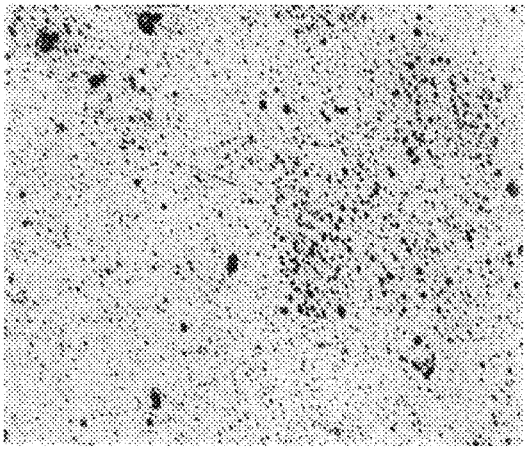
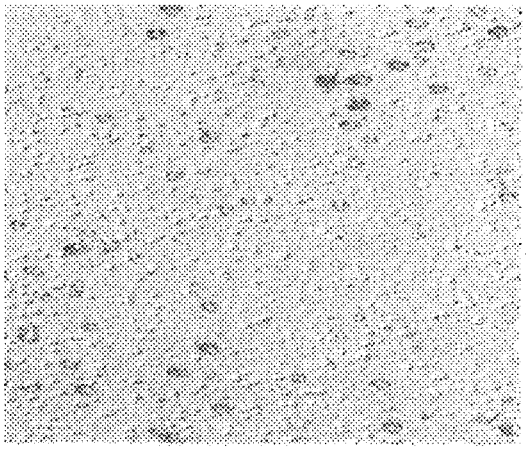
Fig. 4c　　　　　　　　Fig. 4d

POST-EXPOSURE HEAT TREATMENT TO REDUCE SURFACE ROUGHNESS OF PMMA SURFACES FORMED BY RADIATION LITHOGRAPHY

The development of this invention was partially funded by the United States Government under contract number N66001-98-1-8926 from the Defense Advanced Research Projects Agency. The United states Government has certain rights in this invention.

This invention pertains to a method of heat-treating poly(methyl methacrylate) or PMMA structures fabricated by radiation lithography, such as X-ray, electron-beam, or ion beam, to reduce the surface roughness of the bottom and side walls.

The primary use of radiation-exposed PMMA structures is in the LIGA process to produce microstructures. LIGA is a German acronym for lithography, electroforming, and molding. In the first step, a photoresist polymer layer from several microns to a few thousand microns thick, either on a substrate or freestanding, is irradiated through a mask, usually by X-ray, electron-beam, or ion beam radiation. Irradiation changes the characteristics of the polymer (e.g., increases its solubility), such that the irradiated polymer can be removed when developed in an appropriate solution while the unexposed resist remains. After developing, a relief-like polymer structure is left, usually attached to a electroconductive substrate (or it may be glued to a substrate if it was irradiated as a freestanding structure).

In the next step, metal is electro-deposited on the substrate in the spaces in between the remaining polymer structure, giving a metal structure complimentary to the polymer relief and mirroring the original mask shape. The resulting a microstructural element produced may then be used as a mold for casting in mass production, usually in a polymer. One difficulty with the LIGA process as originally described was that it only produced microstructures that were attached to a substrate.

To produce microstructures with a high aspect ratio, deep X-ray lithography is used. Deep X-ray lithography involves a substrate covered by a thick photoresist, typically several thousand microns in thickness, which is exposed by X-rays through a mask. The high energy of X-ray photons makes exposure of thick photoresist films with high throughput feasible. In direct, high throughput LIGA processes, many sheets of PMMA may be stacked together to utilize the deep X-ray beam energy in mass producing exposed PMMA resists. After the exposure, the individual PMMA sheets are solvent bonded to working substrates before further processing. See H. Guckel et al., "Direct, high throughput LIGA for commercial applications: A progress report," Book of Abstract, HARMST '99, Kisarazu, Japan, Jun. 13–15, 1999, p. 2–3 (1999). Deep X-ray lithography allows structures to be produced with heights up to several mm and a lateral resolution down to 0.2 $\mu$m or smaller.

Poly(methyl methacrylate) (PMMA) is the most commonly used photoresist material in X-ray, deep X-ray, and electron-beam lithographies. See Y. Vladimirsky et al., "PMMA as an X-ray resist for micro-machining application: Latent image formation and thickness losses," Microelectronic Engineering, vol 30, pp. 543–546 (1996).

In addition, because of its superior resolution, contrast, mechanical behavior, and optical properties, PMMA is widely used as a structural material for micro-analytical instruments, micro-actuators for medical applications, micro-machine parts, optical components, in prototyping applications, and low-to-medium volume manufacturing. See L. E. Ocola et al., "Parametric modeling of photoelectron effects in X-ray lithography," Journal of Vacuum Science and Technology B, vol. 11, pp. 2839–2844 (1993); U. Gebhard et al., "Combination of a fluidic micro-oscillator and micro-actuator in LIGA-technique for medical application," TRANSDUCERS '97, Chicago, Jun. 16–19, 1997, pp. 761–764 (1997); and C. Muller et al., "Microspectrometer fabricated by the LIGA process," Interdisciplinary Science Reviews, vol. 18, pp. 273–279 (1993).

A drawback to the use of PMMA has been that the bottom and side-wall surfaces of PMMA structures prepared by X-ray exposure and then developed are rough and contain crack-like fissures. See C. K. Malek et al., "Metrology study of structural transfer accuracy in fabrication of high-aspect-ratio microelectromechanical systems: From optical mask to polished electroplated parts," J. Vac. Sci. Technol. B, vol. 16(6), pp. 3552–3557 (1998); and C. M. Egert et al., "Dimensional variation and roughness of LIGA fabricated microstructures," SPIE, vol. 2880, pp. 200–209 (1996). Another study had shown micropore formation on PMMA after an X-ray exposure. See A. L. Bogdanov et al., Mikroelektronika, vol. 17, p. 261 (1988). These rough surfaces directly affect the performance (e.g., optical properties), signal-to-noise ratio, and even the availability of these devices and components. Additionally, the rough surface makes it difficult to glue the exposed PMMA components onto another surface thus limiting the ability to assemble more complex microstructures as envisioned in U.S. Pat. No. 5,496,668. The formation of surface roughness and fissures make batch fabrication of multi-layer PMMA devices and components almost impossible, because of the inability to glue the exposed PMMA structures to a suitable substrate. See C. G. K. Malek et al., "Factors promoting the adhesion of acrylic sheets to metallic structures for LIGA processing," Book of Abstract, HARMST '99, Kisarazu, Japan, Jun. 13–15, 1999, p. 110–111 (1999). See also, M. Chabloz et al., "Improvement of sidewalls roughness in deep silicon etching," Book of Abstract, HARMST '99, Kisarazu, Japan, Jun. 13–15, 1999, p. 26–27 (1999); S. K. Griffiths et al., "The influence of mask substrate thickness on exposure and development times for the LIGA process," Book of Abstract, HARMST '99, Kisarazu, Japan, Jun. 13–15, 1999, p. 86–87 (1999); F. J. Pantenburg et al., "Improved adhesion of deep X-ray lithography resist structures by using a mirror system," Book of Abstract, HARMST '99, Kisarazu, Japan, Jun. 13–15, 1999, p.122 (1999); C. K. Malek et al., "Lithographic related problems in deep X-ray lithography: Radiation-induced formation of volatile species in poly (methylmethacrylate) (PMMA)," Book of Abstract, HARMST '99, Kisarazu, Japan, June 13–15, 1999, p. 112–113 (1999). To fully utilize the potential of PMMA as both a resist and structure material in LIGA, a method to modify and decrease the surface roughness of PMMA structures after radiation exposure is needed. U.S. Pat. No. 4,393,129 describes a method to develop (using the GG developer) exposed resist layers, particularly composed of PMMA, to avoid stress cracks, especially in structures with a high aspect ratio produced by X-ray or electron-beam radiation.

We have discovered a method to decrease the surface roughness of radiation-exposed PMMA surfaces by following the exposure step with a heat treatment. The PMMA surface roughness was decreased by post-exposure heat treatments less than 70° C. The optimum post-exposure heat treatment to produce a PMMA microstructure with a smooth surface was found to be about 60° C. for 30 min. Aside from the enhanced smoothness, the structural features of post-exposure heat-treated PMMA patterns were shown not to be statistically different from identical features of untreated post-exposure PMMA patterns. The post-exposure heat treatment produces a smoother PMMA structure that can then be glued onto a substrate, or that can be assembled with other PMMA structures into a three-dimensional or multi-layer microstructure.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

FIG. 2a is a light photomicrograph of the bottom PMMA surface from a sample exposed without a filter and then developed for 15 min.

FIG. 2b is a light photomicrograph of the bottom PMMA surface from a sample exposed without a filter and then developed for 60 min.

FIG. 2c is a light photomicrograph of the bottom PMMA surface from a sample exposed with a 14 $\mu$m A1 filter and then developed for 15 min.

FIG. 2d is a light photomicrograph of the bottom PMMA surface from a sample exposed with a 14 $\mu$m A1 filter and then developed for 60 min.

FIG. 4a is a light photomicrograph of the bottom PMMA surface from a sample exposed without a filter, then given a post-exposure heat treatment of 60° C. for 30 min before developing for 15 min.

FIG. 4b is a light photomicrograph of the bottom PMMA surface from a sample exposed without a filter, then given a post-exposure heat treatment of 60° C. for 30 min before developing for 60 min.

FIG. 4c is a light photomicrograph of the bottom PMMA surface from a sample exposed with a 14 $\mu$m A1 filter, then given a post-exposure heat treatment of 60° C. for 30 min before developing for 15 min.

FIG. 4d is a light photomicrograph of the bottom PMMA surface from a sample exposed with a 14 $\mu$m A1 filter, then given a post-exposure heat treatment of 60° C. for 30 min before developing for 60 min.

EXAMPLE 1

Materials and Methods

Clinical grade PMMA (Goodfellow (CQ), Berwyn, Pa.) was used in this study. All PMMA samples had dimensions of 10×20 mm, which allowed exposure of 24 samples at one time. To reduce residual stresses and swelling of the PMMA during the irradiation process, all samples were given a pre-exposure heat treatment at 80° C. for 3 hr. Samples of 24 were exposed using a XRLM3 "white light" X-ray lithography beamline installed on the 1.3–1.5 GeV electron storage ring on the synchrontron located at Center for Advanced Microstructures and Devices, Louisiana State University, Baton Rouge, La. Samples were exposed both without a filter and with various sizes of aluminum filters (3 $\mu$m, 6 $\mu$m, 9 $\mu$m and 14 $\mu$m; Goodfellow, Berwyn, Pa.) to narrow the exposure spectrum. The bottom dose was 3 kj/cm$^3$ with a calculated depth of 100 $\mu$m for all samples. Development of the exposed PMMA samples was in GG developer at room temperature as described in U.S. Pat. No. 4,393,129.

After developing, the surface morphology and roughness of the samples were examined using an optical microscope. Measurements of the PMMA smooth and rough surfaces were taken by a surface profiling system, TANCOR P-2 Long Scan Profiler Meter (Tencor Instruments, Mountain View, Calif.). The root mean square roughness ($R_q$) was chosen to evaluate the surface roughness changes and to compare samples from different treatments. The $R_q$ is the root mean square average of the measured height deviations within the evaluation length or area as measured from the mean planar surface, as described in RST Plus Technical Reference Manual, WYKO Corporation (Tucson, Ariz.).

To evaluate whether any dimensional changes in the microstructural patterns were caused by post-exposure heat treatment, three otherwise identical features of various sizes from 26 $\mu$m to 146 $\mu$m were compared between samples with and without a post-exposure heat treatment. The measurements from different treatments were compared using Student's T-test.

EXAMPLE 2

Effects of Filter Thickness and Development Time on Surface Roughness

PMMA samples (10×20 mm) were prepared as described in Example 1. The samples were then exposed under different conditions: either without a filter or with an aluminum filter of various thicknesses (3 $\mu$m, 6 $\mu$m, 9 $\mu$m or 14 $\mu$m). After the X-ray exposure, the exposed PMMA samples (at least 4 samples from each treatment) were developed in GG developer for timed intervals. After each interval, the samples were profiled to measure the $R_q$. The samples were then further developed until the next time interval. The developing time intervals were 20, 30, 40, 60 and 120 min.

Figure 1:
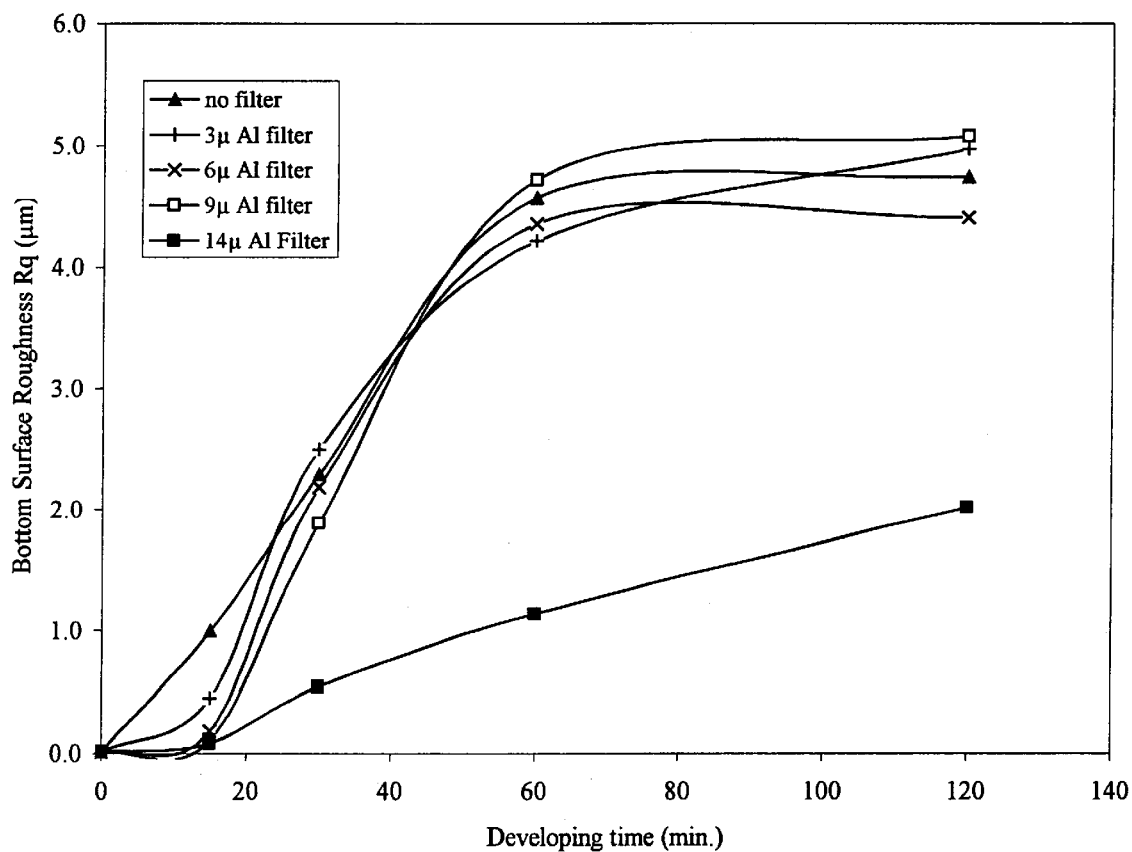
FIG. 1 depicts the PMMA bottom surface roughness as a function of developing time for various thicknesses of aluminum (A1) filters.

FIG. 1 indicates that the root mean square roughness ($R_q$) value increased as a function of developing time for all samples, reaching a plateau at about 60 min. Thus a shorter developer time reduced the bottom surface roughness.

FIG. 1 shows that, when using an energy source as described in Example 1, the thickest filter, 14 $\mu$m A1, reduced the surface roughness considerably. In contrast, for the same developing time, samples exposed with 3 $\mu$m, 6 $\mu$m, and 9 $\mu$m A1 filters showed no substantial differences from exposure without a filter. For PMMA samples that were exposed with white X-ray using aluminum filters less than 9 $\mu$m thick, at the lowest dose of 3 kJ/cm$^3$ at 100 $\mu$m, the root mean square roughness value was around 5 $\mu$m. For the PMMA samples that were similarly exposed with a 14 $\mu$m A1 filter, the roughness value was around 2 $\mu$m.

When viewed in an optical microscope, the samples exposed without a filter displayed many crack-like fissures on the bottom surface at 15 min developing time. (FIG. 2a). The number of cracks increased dramatically at 60 min developing time. (FIG. 2b) In contrast, samples exposed with the 14 $\mu$m A1 filter showed no signs of crack-like fissures, but did show a few small pits at 15 min developing time. (FIG. 2c) The number of visible pits increased at 60 min developing time. (FIG. 2d).

From X-ray transmission data, the 14 $\mu$m A1 filter stopped more than 80% of the radiation with an energy less than 4000 eV. In contrast, when the aluminum filter was 9 μm, only 50% of the radiation was stopped at the same energy. Thus, under the radiation conditions of this system, narrowing the exposure spectrum with a 14 μm Al filter considerably reduced surface roughness.

EXAMPLE 3

Effects of Post-Exposure Heat Treatment on Surface Roughness

Samples were prepared as in Example 1 and exposed either with no filter or with a 14 μm Al filter. The exposed PMMA samples were then left at room temperature or given a heat treatment at 40°, 45°, 50°, 55°, 60°, 65°, and 70° C., before developing. There were at least four samples per treatment All samples were then developed and measured as in Example 1.

Figure 3:
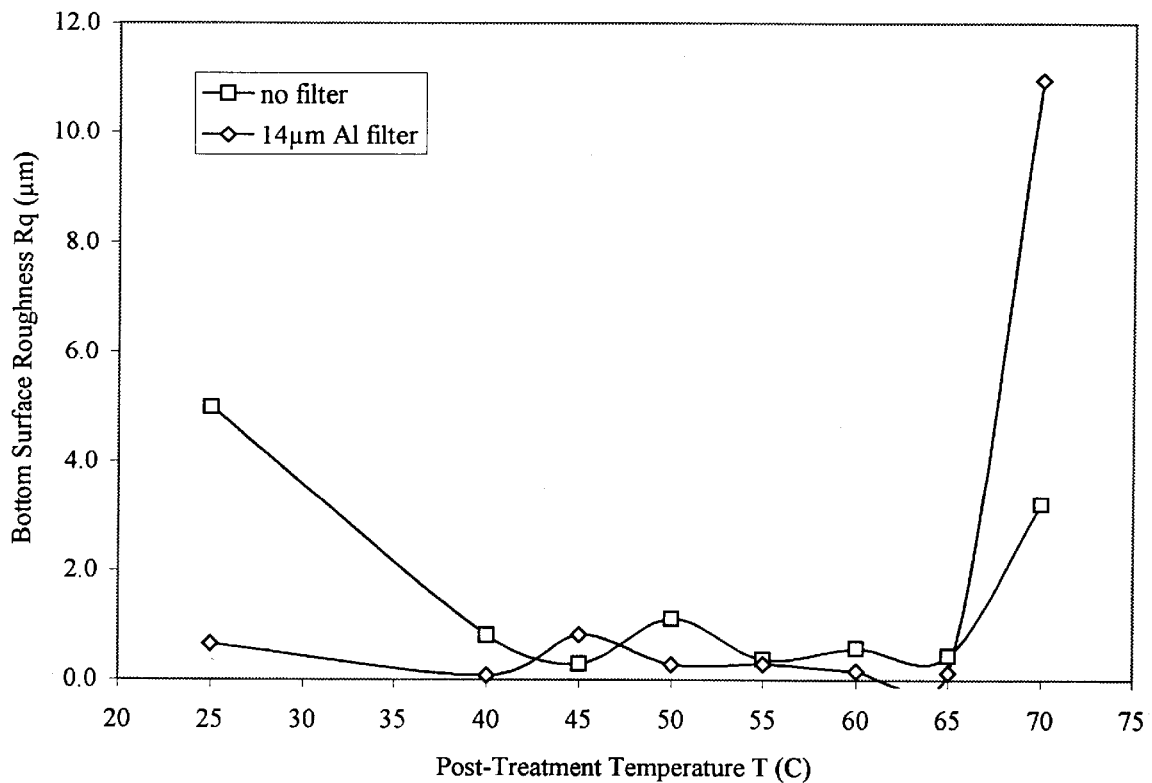
FIG. 3 depicts the PMMA bottom surface roughness of samples exposed with and without a 14 $\mu$m A1 filter as a function of the temperature of the post-exposure heat treatment.

FIG. 3 depicts the relationship between surface roughness ($R_q$) and the temperature of the post-exposure heat treatment for 30 min. All samples for FIG. 3 were developed in the GG developer for 60 min. For all samples, both without and with a filter, post-exposure heat treatments between about 40° C. and about 65° C. showed a dramatic reduction in surface roughness. However, post-exposure heat treatment at 70° C. resulted in an increase in surface roughness for all groups. In fact, a white foaming structure occurred at this temperature, probably caused by fast degassing. These results show that a post-exposure heat treatment at temperatures less than about 65° C. is effective in reducing surface roughness. At 60° C., the $R_q$ value of the bottom surface dropped from 4.7 μm to less than 1 μm in samples exposed without a filter, and from 1 μm to less than 0.1 μm, for samples exposed with a 14 μm Al filter.

Microscopic examination confirmed that PMMA surfaces after post-exposure heat treatment were smoother. In the samples exposed without a filter with a post-exposure heat treatment of 60° C. for 30 min, no crack-like features were seen at a developing time of either 15 min (FIG. 4a) or 60 min (FIG. 4b). In the samples exposed with a 14 μm Al filter with the same post-exposure heat treatment, no pits were seen at either 15 min (FIG. 4c) or 60 min (FIG. 4d). Comparing FIG. 2 with FIG. 4 clearly indicates that post-exposure heat treatment greatly decreased the surface roughness. Without wishing to be bound by this theory, it is believed that the post-exposure heat treatment may collapse pores by melting that form on the PMMA after X-ray exposure resulting in a smoother bottom surface.

EXAMPLE 4

Effect of Post-Exposure Heat Treatment Time at 60 ° C.

Figure 5:
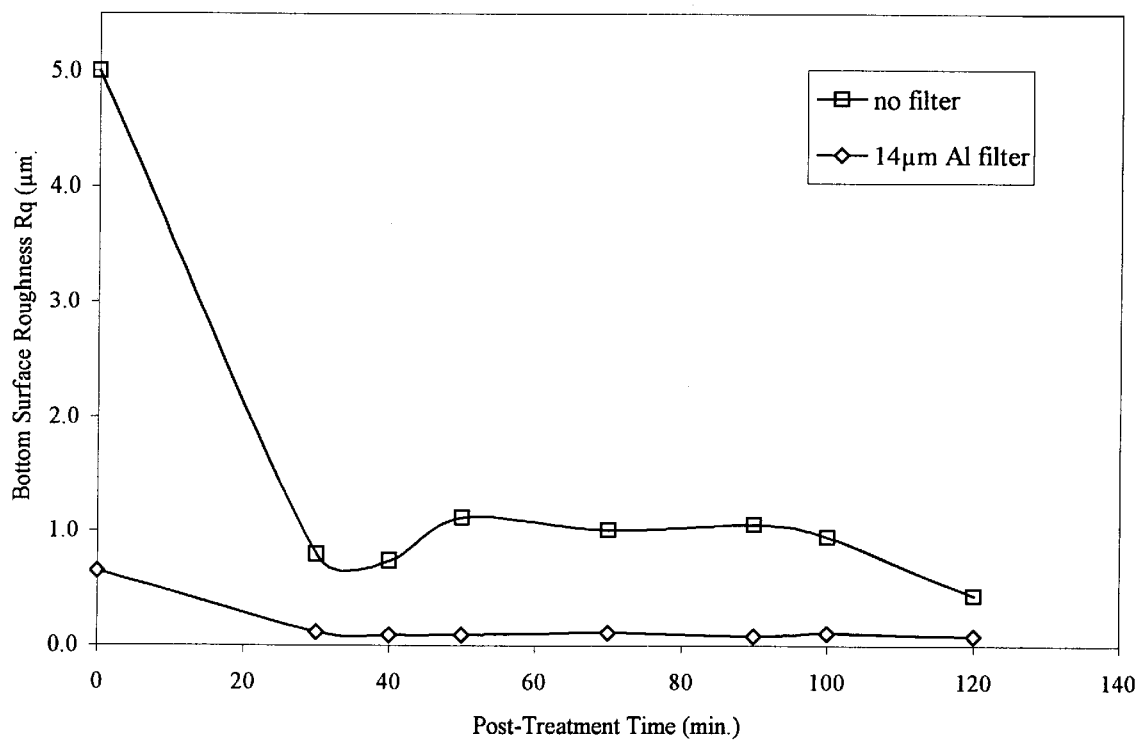
FIG. 5 depicts the PMMA bottom surface roughness of samples exposed without a filter and with a 14 $\mu$m A1 filter as a function of the time of post-exposure heat treatment at 60° C.

The relationship between decreasing surface roughness and the time of post-exposure heat treatment was investigated at 60° C. After the post-exposure heat treatment time exceeded about 20 min, the surface roughness as measured by $R_q$ stabilized for samples exposed both with and without a filter, as shown in FIG. 5. The preferred post-exposure heat treatment was to heat at 60° C. for about 30 min.

EXAMPLE 5

Effect of Post-Exposure Heat Treatment on the Precision of PMMA structures

For practical use in producing microstructures, the post-exposure heat treatment must not substantially change the PMMA structure formed during the X-ray exposure. In Table 1 are comparisons of otherwise identical features in patterns from untreated samples to those from samples given a post-exposure exposure heat treatment of 60° C. for 40 min. For both groups, two types of PMMA samples were used. The first group comprised conventional PMMA samples that had been glued to a silicon wafer substrate prior to exposure, the "Si substrate PMMA samples." The second group comprised freestanding PMMA samples. Three features, varying in size from 26 μm to 146 mm, were measured for comparison. Student's T-test showed no significant differences in structural dimensions between post-exposure heat-treated PMMA samples and untreated PMMA samples. The sample size was at least 9 for each sample group. The student's T-test was a two-tailed test with a significance level of p<0.03, with a null hypothesis of no difference between the two groups.

TABLE 1

Student's T-Test Results for Treated and Untreated PMMA Samples

| Feature Size | Samples Compared | Probability |
| --- | --- | --- |
| S1 (26 μm) | Treated and Untreated Si Substrate PMMA Samples | P = 0.78 NS |
| S2 (101 μm) | Treated and Untreated Si Substrate PMMA Samples | P = 0.35 NS |
| S3 (146 μm) | Treated and Untreated Si Substrate PMMA Samples | P = 0.30 NS |
| S1 (26 μm) | Treated and Untreated Freestanding PMMA Samples | P = 0.05 NS |
| S2 (101 μm) | Treated and Untreated Freestanding PMMA Samples | P = 0.08 NS |
| S3 (146 μm) | Treated and Untreated Freestanding PMMA Samples | P = 0.60 NS |

Post-exposure heat treatment substantially reduces roughness of the PMMA surface on the bottom or on side walls following development, without significantly altering dimensions. A smoother PMMA surface will allow better attachment of microstructures to one another by gluing to manufacture three-dimensional or multilayer LIGA structures. It also allows for fabrication of multilayer, freestanding PMMA devices that can be glued after exposure to an appropriate substrate before developing. The post-exposure heat treatment will also reduce the effects of back radiation in deep X-ray lithography by smoothing the side walls of the PMMA resist near the substrate. Additionally, the residual stress caused by the radiation will be reduced.

The complete disclosures of all references cited in this specification are hereby incorporated by reference. Also incorporated by reference is the full disclosure of the following unpublished document: K. Lian, Z. -G. Ling, and S. B. Looney, "PMMA Surface Morphology Change as the Function of X-ray Exposing Condition and Post Heat Treatment," submitted to Microsystem Technologies, Jun. 13, 1999. Also incorporated by reference is the fill disclosure of the following abstract: K. Lian and Z. -G. Ling, "PMMA Surface Morphology Change as the Function of X-ray Exposing Condition and Post Heat Treatment," published in the HARMST '99, Book of Abstract, 13–15 Jun. 1999, Kisarazu, Japan. In the event of an otherwise irreconcilable conflict, however, the present specification shall control.

We claim:

1. A method for producing a microstructure in a poly (methyl methacrylate) resist attached to a substrate during radiation exposure, comprising the steps of:

(a) exposing the resist to radiation in a pattern corresponding to the microstructure, wherein the irradiation suffices to form a latent image in the resist; and (b) heating the resist with the latent image to a temperature between about 40° C. and about 65° C.; and (c) developing the latent image to produce a poly(methyl methacrylate) microstructure; wherein:

(d) the duration of said heating step is sufficient to reduce the surface roughness of the produced microstructure substantially below the surface roughness of a microstructure that would be produced by an otherwise identical method that omits said heating step.

2. A method as recited in claim 1, wherein said heating step comprises heating the resist with the latent image to about 60° C.

3. A method as recited in claim 1, wherein the duration of said heating step is between about 20 min and about 120 min.

4. A method as recited in claim 1, wherein duration of said heating step is about 30 min.

5. A method as recited in claim 1, additionally comprising the step of narrowing the spectrum of the radiation with a filter.

6. A method as recited in claim 5, wherein said exposing step comprises exposing the resist to X-ray radiation, and wherein the filter is an aluminum filter having a thickness about 14 $\mu$m.

7. A method as recited in claim 1, wherein said exposing step comprises exposing the resist to X-ray irradiation.

8. A method as recited in claim 1, wherein said exposing step comprises exposing the resist to an electron-beam.

9. A method as recited in claim 1, wherein said exposing step comprises exposing the resist to an ion beam.

10. A microstructure produced by the method of claim 6, wherein said microstructure has a root mean square bottom surface roughness less than 0.1 $\mu$m.

11. A method for producing a microstructure in a poly(methyl methacrylate) resist freestanding during radiation exposure, comprising the steps of:

(a) exposing the resist to radiation in a pattern corresponding to the microstructure, wherein the irradiation suffices to form a latent image in the resist; and (b) heating the resist with the latent image to a temperature between about 40° C. and about 65° C.;

(c) attaching the resist to a substrate; and (d) developing the latent image to produce a poly(methyl methacrylate) microstructure; wherein:

(e) the duration of said heating step is sufficient to reduce the surface roughness of the produced microstructure substantially below the surface roughness of a microstructure that would be produced by an otherwise identical method that omits said heating step.

12. A method as recited in claim 11, wherein said heating step comprises heating the resist with the latent image to about 60° C.

13. A method as recited in claim 11, wherein the duration of said heating step is between about 20 min and about 120 min.

14. A method as recited in claim 11, wherein duration of said heating step is about 30 min.

15. A method as recited in claim 11, additionally comprising the step of narrowing the spectrum of the radiation with a filter.

16. A method as recited in claim 15, wherein said exposing step comprises exposing the resist to X-ray radiation, and wherein the filter is an aluminum filter having a thickness about 14 $\mu$m.

17. A method as recited in claim 11, wherein said exposing step comprises exposing the resist to X-ray irradiation.

18. A method as recited in claim 11, wherein said exposing step comprises exposing the resist to an electron-beam.

19. A method as recited in claim 11, wherein said exposing step comprises exposing the resist to an ion beam.

20. A microstructure produced by the method of claim 16, where said microstructure has a root mean square bottom surface roughness less than about 0.1 $\mu$m.

21. A poly(methyl methacrylate) microstructure comprising at least one feature having a characteristic dimension less than about 10 $\mu$m in at least one direction, wherein said microstructure has a root mean square bottom surface roughness less than about 0.1 $\mu$m.

* * * * *